United States Patent
Lee et al.

(10) Patent No.: US 11,711,901 B2
(45) Date of Patent: Jul. 25, 2023

(54) DISPLAY DEVICE AND ELECTRONIC DEVICE HAVING THE SAME

(71) Applicant: Samsung Display Co., Ltd., Yongin-si (KR)

(72) Inventors: Heeyoung Lee, Hwaseong-si (KR); Jin Yong Sim, Seongnam-si (KR); Jung-Hun Lee, Hwaseong-si (KR); Jihwa Lee, Hwaseong-si (KR); Sung Chul Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 46 days.

(21) Appl. No.: 17/323,609

(22) Filed: May 18, 2021

(65) Prior Publication Data
US 2022/0061177 A1 Feb. 24, 2022

(30) Foreign Application Priority Data
Aug. 20, 2020 (KR) ........................ 10-2020-0104409

(51) Int. Cl.
| H05K 5/03 | (2006.01) |
| G06F 3/044 | (2006.01) |
| H05K 5/00 | (2006.01) |
| H05K 7/20 | (2006.01) |

(52) U.S. Cl.
CPC ............ *H05K 5/03* (2013.01); *G06F 3/044* (2013.01); *H05K 5/0017* (2013.01); *H05K 7/20963* (2013.01)

(58) Field of Classification Search
CPC .... H05K 5/03; H05K 5/0017; H05K 7/20963; G06F 3/044
See application file for complete search history.

(56) References Cited

U.S. PATENT DOCUMENTS

| 9,857,506 B2 | 1/2018 | Kim |
| 9,857,510 B2 | 1/2018 | Yi |
| 10,642,109 B2 | 5/2020 | Ko et al. |
| 2017/0200914 A1 | 7/2017 | Min |
| 2017/0232701 A1 | 8/2017 | Keite-Telgenbüscher et al. |

(Continued)

FOREIGN PATENT DOCUMENTS

| EP | 3 664 148 | 6/2020 |
| KR | 10-2015-0015339 | 2/2015 |

(Continued)

OTHER PUBLICATIONS

Extended European search report for European Patent Application or Patent No. 21191184.7 dated Jan. 7, 2022.

*Primary Examiner* — Afroza Chowdhury
(74) *Attorney, Agent, or Firm* — Kile Park Reed & Houtteman PLLC

(57) ABSTRACT

A display device includes a display module having a display region and a non-display region, and a window module disposed on the display module. The window module includes a thin glass substrate, a window protective layer disposed on the thin glass substrate, and a bezel pattern disposed on a surface of the thin glass substrate or disposed on a surface of the window protective layer. The bezel pattern overlaps the non-display region. The edge of the thin glass substrate does not overlap the bezel pattern in a plan view, and the edge of the thin glass substrate is not aligned with the outer edge of the bezel pattern in a plan view.

27 Claims, 16 Drawing Sheets

(56) References Cited

U.S. PATENT DOCUMENTS

| | | | | |
|---|---|---|---|---|
| 2018/0062094 A1* | 3/2018 | Kwon | ................ | H01L 51/5293 |
| 2018/0312430 A1* | 11/2018 | Lambright | .............. | C03C 3/087 |
| 2019/0062203 A1* | 2/2019 | Gross | .................... | G06F 1/1637 |
| 2019/0073961 A1* | 3/2019 | Park | ..................... | G09G 3/2092 |
| 2019/0100457 A1* | 4/2019 | Luzzato | .................. | C03C 15/00 |
| 2019/0107866 A1* | 4/2019 | Han | ........................ | G06F 3/047 |
| 2021/0384476 A1 | 12/2021 | Sim et al. | | |

FOREIGN PATENT DOCUMENTS

| | | |
|---|---|---|
| KR | 10-2017-0059543 | 5/2017 |
| KR | 10-2018-0046199 | 5/2018 |
| KR | 10-2004220 | 7/2019 |
| KR | 10-2021-0153495 | 12/2021 |

* cited by examiner

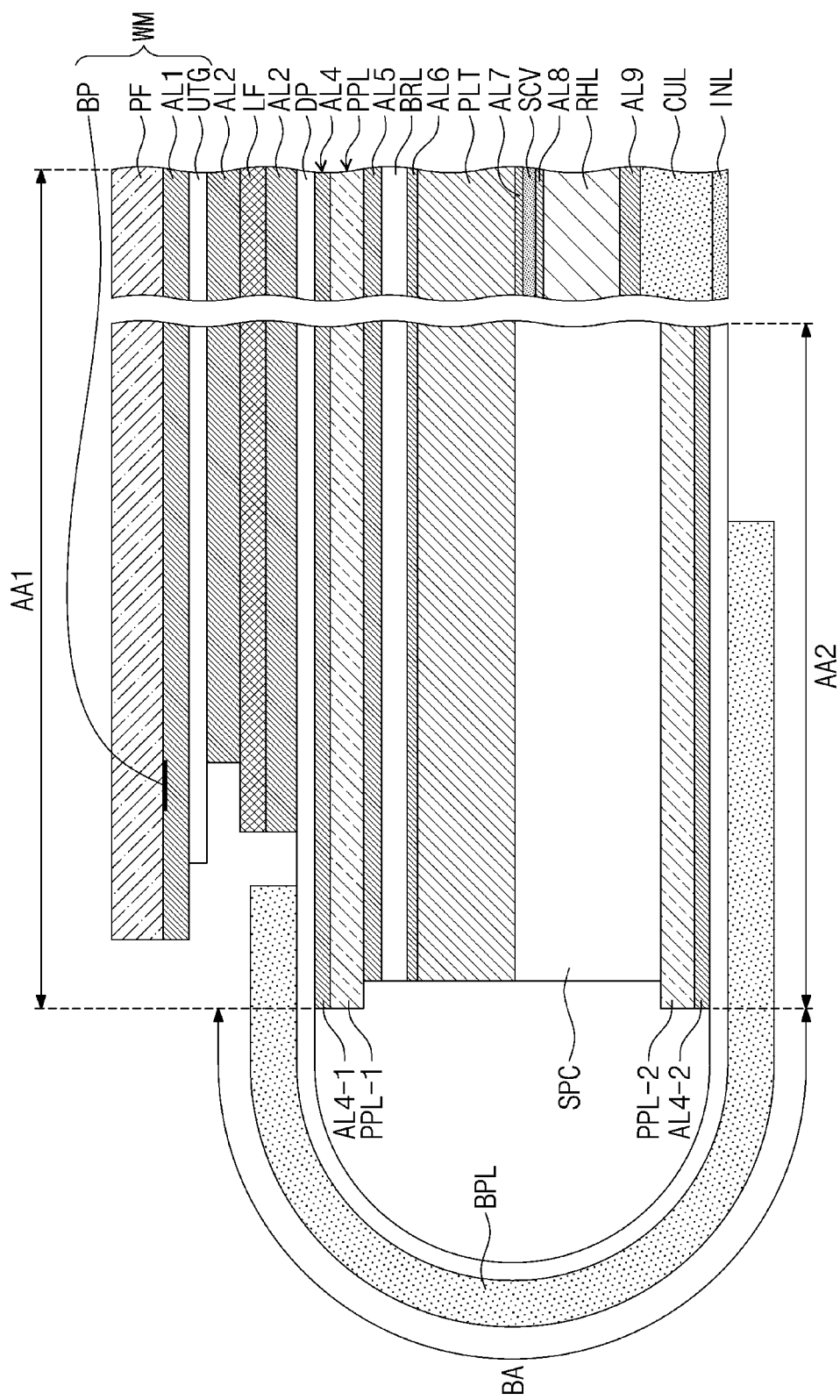

DISPLAY DEVICE AND ELECTRONIC DEVICE HAVING THE SAME

CROSS-REFERENCE TO RELATED APPLICATION(S)

This U.S. non-provisional patent application claims priority to and benefits of Korean Patent Application No. 10-2020-0104409 under 35 U.S.C. § 119, filed on Aug. 20, 2020 in the Korean Intellectual Property Office, the entire contents of which are hereby incorporated by reference.

BACKGROUND

The disclosure herein relates to a display device and an electronic device having the same, and more particularly, to a foldable display device and an electronic device having the same.

A display device in general includes a display region that is activated and controlled in response to electrical signals. The display device may sense input applied from the outside through the display region and provide information to a user by displaying various images. As display devices are being developed to have various shapes, display regions are also being developed to have various shapes that may accommodate to the shapes of the display devices.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

This disclosure provides a display device capable of facilitating the inspection of defects in a window module.

This disclosure also provides an electronic device including a display device capable of facilitating the inspection of defects in a window module.

A display device according to an embodiment may include a display module including a display region and a non-display region, and a window module disposed on the display module. The window module may include a thin glass substrate; a window protective layer disposed on the thin glass substrate; and a bezel pattern disposed on a surface of the thin glass substrate or on a surface of the window protective layer. The bezel pattern may overlap the non-display region. The edge of the thin glass substrate may not overlap the bezel pattern in a plan view. The edge of the thin glass substrate may not be aligned with the outer edge of the bezel pattern in a plan view.

In an embodiment, the window protective layer may include a plastic film, and the window module may further include an adhesive layer for attaching the plastic film and the thin glass substrate.

In an embodiment, the edge of the thin glass substrate may be disposed between the edge of the plastic film and the outer edge of the bezel pattern in a plan view.

In an embodiment, a distance between the outer edge of the bezel pattern and the edge of the thin glass substrate may be about 10 μm or more in a plan view.

In an embodiment, a distance between the edge of the thin glass substrate and the edge of the plastic film may be about 50 μm or more in a plan view.

In an embodiment, a distance between the edge of the plastic film and the outer edge of the bezel pattern may be about 60 μm or more.

In an embodiment, the edge of the plastic film and the edge of the adhesive layer may be aligned in a plan view.

In an embodiment, the bezel pattern may be disposed between the adhesive layer and the plastic film.

In an embodiment, the adhesive layer may be separable from the thin glass substrate.

In an embodiment, the bezel pattern may include an inner bezel pattern and an outer bezel pattern, and the inner bezel pattern and the outer bezel pattern may be spaced apart from each other in a plan view.

In an embodiment, the edge of the thin glass substrate may be disposed between an outer edge of the inner bezel pattern and an inner edge of the outer bezel pattern in a plan view.

In an embodiment, the edge of the thin glass substrate may be aligned with an inner edge of the outer bezel pattern in a plan view.

In an embodiment, an outer edge of the outer bezel pattern may be aligned with an edge of the window protective layer or disposed inside the edge of the window protective layer in a plan view.

In an embodiment, at least one of the inner bezel pattern and the outer bezel pattern may have a closed line shape in a plan view.

In an embodiment, the edge of the thin glass substrate may be disposed inside the edge of the window protective layer in a plan view.

In an embodiment, a thickness of the thin glass substrate may be in a range of about 15 μm to about 100 μm.

In an embodiment, the thin glass substrate may be a chemically strengthened glass In an embodiment, the display device may be foldable.

In an embodiment, display module may include a display panel; an input sensor disposed on the display panel; an optical film disposed on the input sensor; and a lower member disposed under the display panel.

In an embodiment, the lower member may include a protective layer disposed under the display panel; a barrier layer disposed under the protective layer; a support layer disposed under the barrier layer; a cover layer disposed under the support layer; a heat dissipation layer disposed under the cover layer, a cushion layer disposed under the heat dissipation layer; and an insulation layer disposed under the cushion layer.

In an embodiment, a display device may include a display panel; an input sensor contacting an upper surface of the display panel; an optical film disposed on the input sensor and coupled to the input sensor by a first adhesive layer; a thin glass substrate disposed on the optical film and coupled to the optical film by a second adhesive layer; a plastic film disposed on the thin glass substrate and coupled to the thin glass substrate by a third adhesive layer; and a bezel pattern disposed between the third adhesive layer and the plastic film. An edge of the thin glass substrate may not overlap the bezel pattern in a plan view. The edge of the thin glass substrate may not be aligned with an outer edge of the bezel pattern in a plan view.

In an embodiment, the edge of the thin glass substrate may be disposed inside the edge of the plastic film in a plan view.

In an embodiment, an edge of the third adhesive layer may be aligned with the edge of the plastic film in a plan view.

In an embodiment, an electronic device may include a display device; an electronic module electrically connected to the display device; and a case accommodating the display device and the electronic module. The display device may include a display module including a display area and a non-display area; and a window module disposed on the display module. The window module may include a thin glass substrate; a window protective layer disposed on the thin glass substrate; and a bezel pattern disposed on a surface of the thin glass substrate or on the lower surface of the window protective layer, and overlapping the non-display area. The edge of the thin glass substrate may not overlap the bezel pattern in a plan view. The edge of the thin glass substrate may not be aligned with an outer edge of the bezel pattern in a plan view. The case may overlap a part of the window module in a plan view.

In an embodiment, an edge of the case may be aligned with the outer edge of the bezel pattern or may be overlap the bezel pattern.

In an embodiment, the bezel pattern may include an inner bezel pattern and an outer bezel pattern which are spaced apart from each other in a plan view. The edge of the case may be aligned with the outer edge of the inner bezel pattern or overlap the inner bezel pattern.

BRIEF DESCRIPTION OF THE DRAWINGS

The above and other aspects and features of the disclosure will become more apparent by describing in detail embodiments thereof with reference to the attached drawings, in which:

FIG. 4C is a schematic cross-sectional view of a display device according to an embodiment;

DETAILED DESCRIPTION OF THE EMBODIMENTS

Figure 1A:
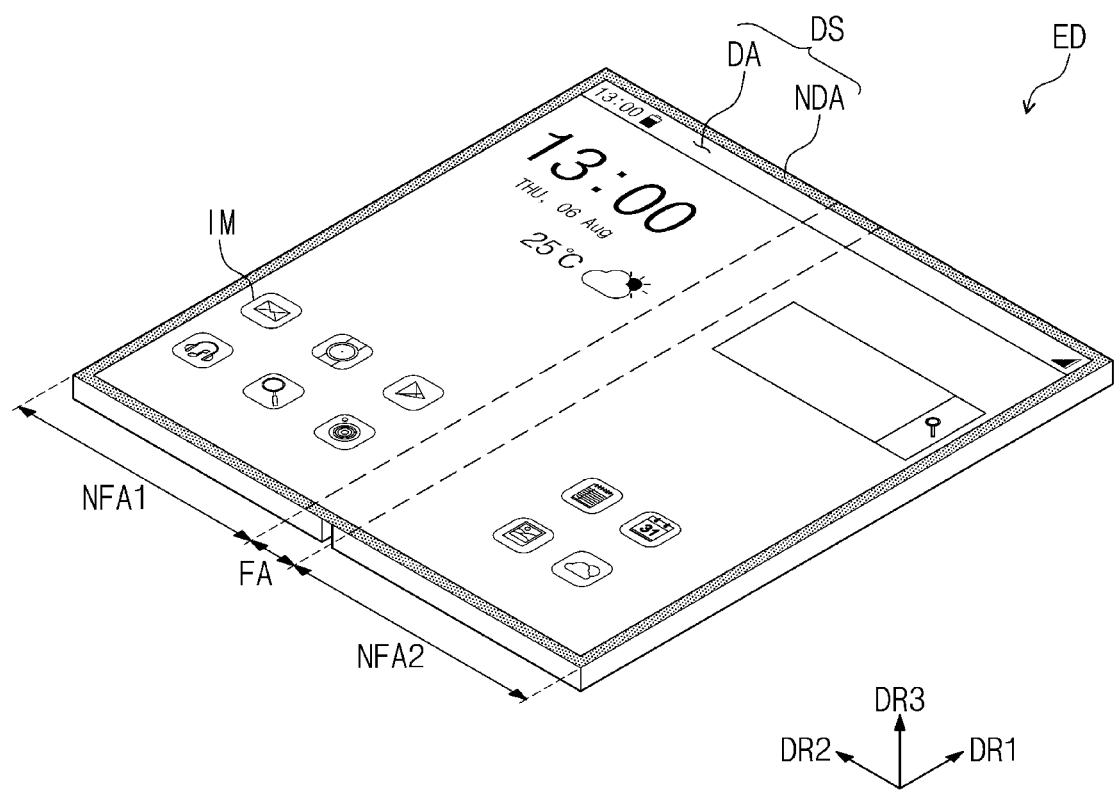
FIGS. 1A and 1B are schematic perspective views of an electronic device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the specification, when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like numbers refer to like elements throughout. In addition, the sizes and thicknesses of elements may be enlarged for clarity and ease of description. The ratios and the dimensions of some elements may be exaggerated. As used herein, the term "and/or" includes any and all combinations of one or more of the associated listed items.

The terms such as first and second may be used to describe various components, but the components should not be limited by the terms. The terms are used only for the purpose of distinguishing one component from another component. For example, without departing from the scope of the disclosure, a first component may be referred to as a second component, and similarly, a second component may be referred to as a first component. Singular expressions include plural expressions unless the context clearly indicates otherwise.

In addition, terms such as "below," "lower," "above," and "upper" are used to describe the relationship between components illustrated in the drawings. The terms are relative concepts and are described based on the directions indicated in the drawings. Further, in the specification, the phrase "in a plan view" means when an object portion is viewed from above, and the phrase "in a cross-sectional view" means when a cross-section taken by vertically cutting an object portion is viewed from the side.

It will be further understood that the terms like "includes" and/or "comprises", when used in this specification, specify the presence of stated features, integers, steps, operations, elements, and/or components, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Figure 1B:
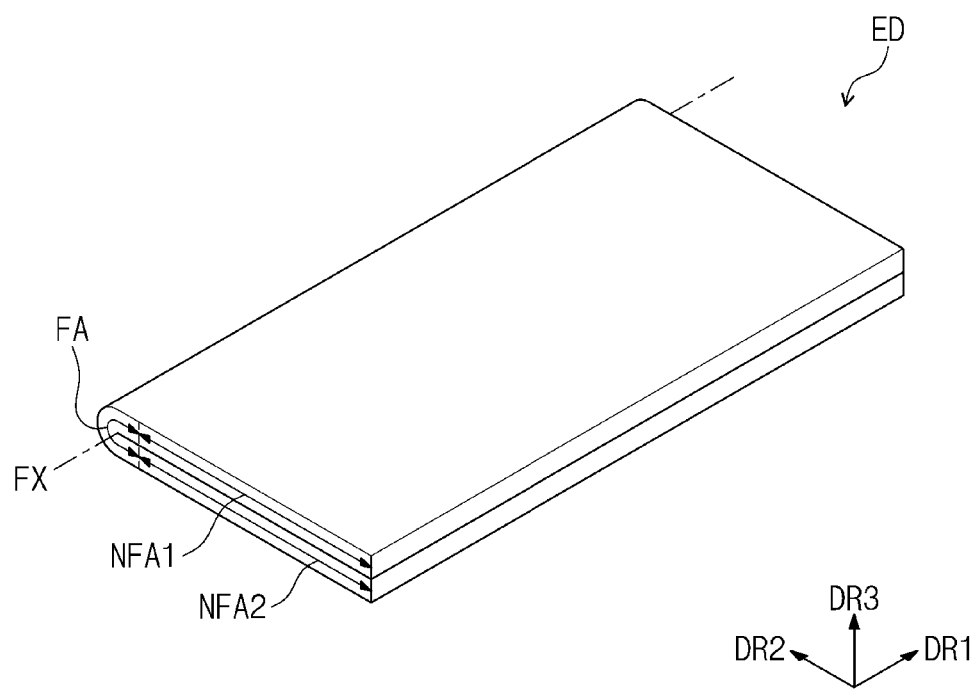

FIG. 1A and FIG. 1B are schematic perspective views of the electronic device ED. FIG. 1A illustrates an unfolded state, and FIG. 1B illustrates a folded state.

Referring to FIG. 1A and FIG. 1B, an electronic device ED according to an embodiment may include a display surface DS defined by a first direction DR1 and a second direction DR2 intersecting the first direction DR1. The electronic device ED may provide an image IM to a user through the display surface DS.

The display surface DS may include a display region DA and a non-display region NDA around the display region DA. The display region DA may display the image IM and the non-display region NDA may not display the image IM. The non-display region NDA may surround the display region DA. However, the embodiments are not limited thereto, and the shape of the display region DA and the shape of the non-display region NDA may be modified.

Hereinafter, in the specifications and drawings, the third direction DR3 refers to a normal direction with respect to the plane defined by the first direction DR1 and the second direction DR2. The thickness direction of electronic device ED may be parallel to DR3. The first, the second, and the third directions DR1, DR2 and DR3 refer to the same reference symbols in directions respectively indicated by the first to a third directional axes.

The electronic device ED may include a folding region FA and multiple non-folding region NFA1 and NFA2. The non-folding regions NFA1 and NFA2 may include a first non-folding region NFA1 and a second non-folding region NFA2. In the second direction DR2, the folding region FA may be disposed between the first non-folding region NFA1 and the second non-folding region NFA2.

As illustrated in FIG. 1B, the folding region FA may be folded with respect to a folding axis FX parallel to the first direction DR1. The folding region FA has a predetermined curvature and a radius of curvature. The first non-folding region NFA1 and the second non-folding region NFA2 face each other, and the electronic device ED may be innerfolded so that the display surface DS is not exposed to the outside.

In other embodiments, the electronic device ED may be outer-folded so that the display surface DS is exposed to the outside. In an embodiment, the electronic device ED may be configured to be repeatedly inner-folded and outer-folded after being unfolded. However, the embodiments are not limited thereto. In an embodiment, the electronic device ED may be configured to select one of an unfolding operation, an inner-folding operation, or an outer-folding operation.

Figure 2A:
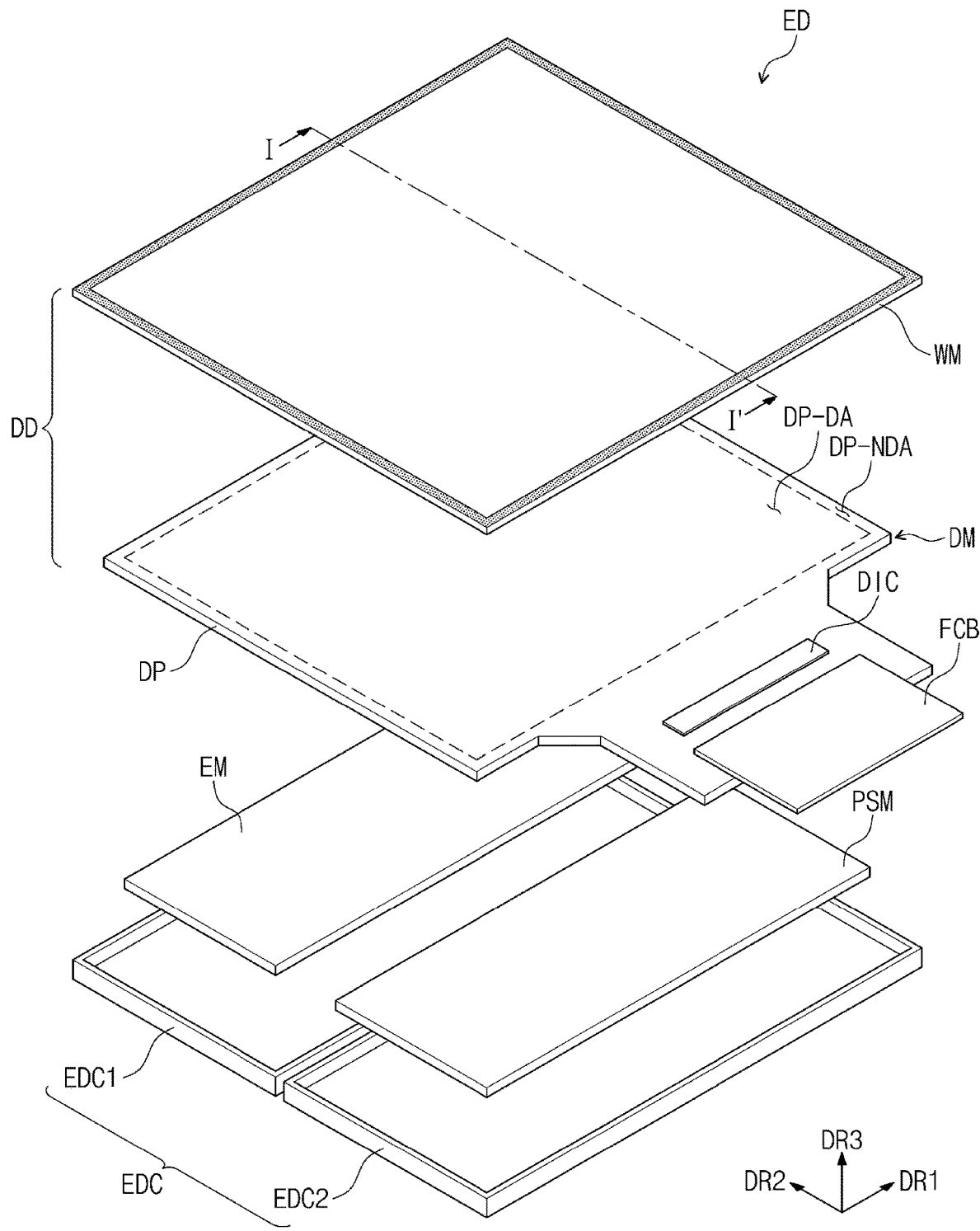
FIG. 2A is an exploded schematic perspective view of an electronic device according to an embodiment.
Figure 2B:
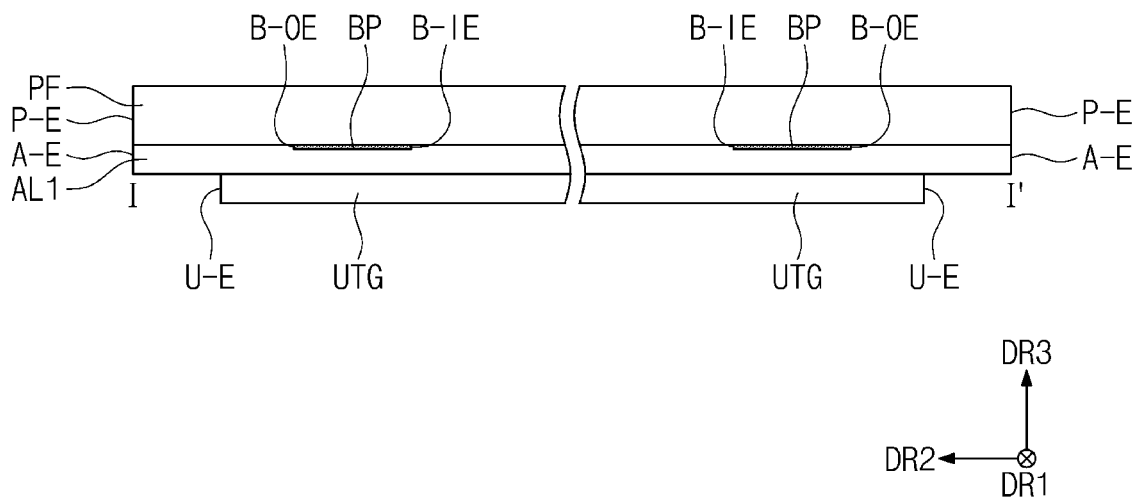
FIGS. 2B to 2D are schematic cross-sectional views of a window module according to an embodiment.
Figure 2C:
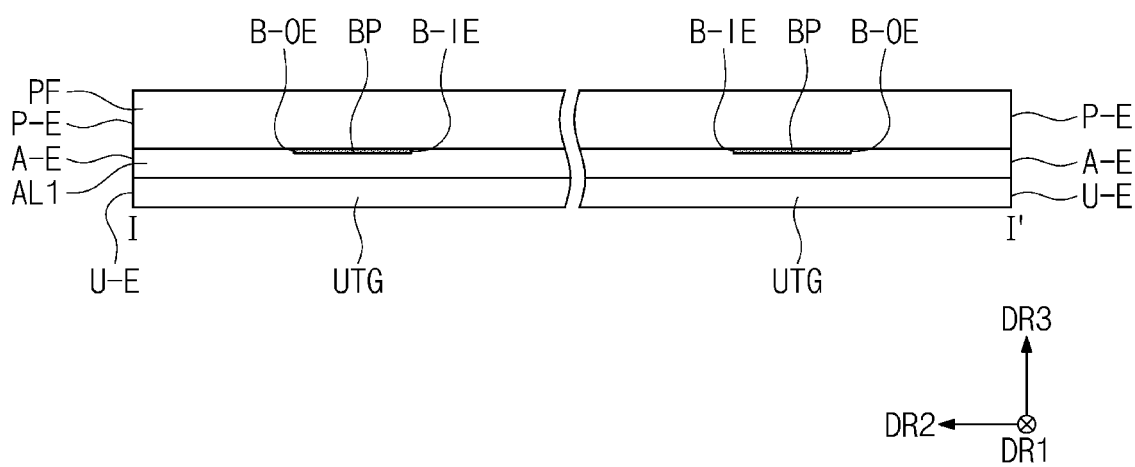
Figure 2D:
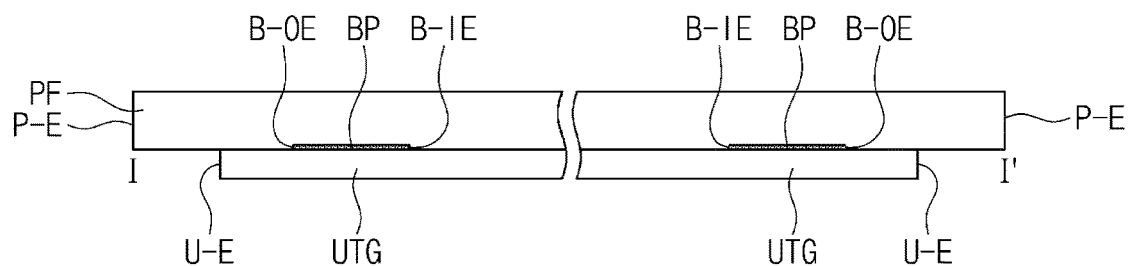
Figure 2D:
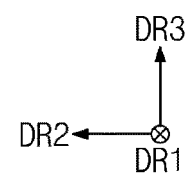
Figure 2E:
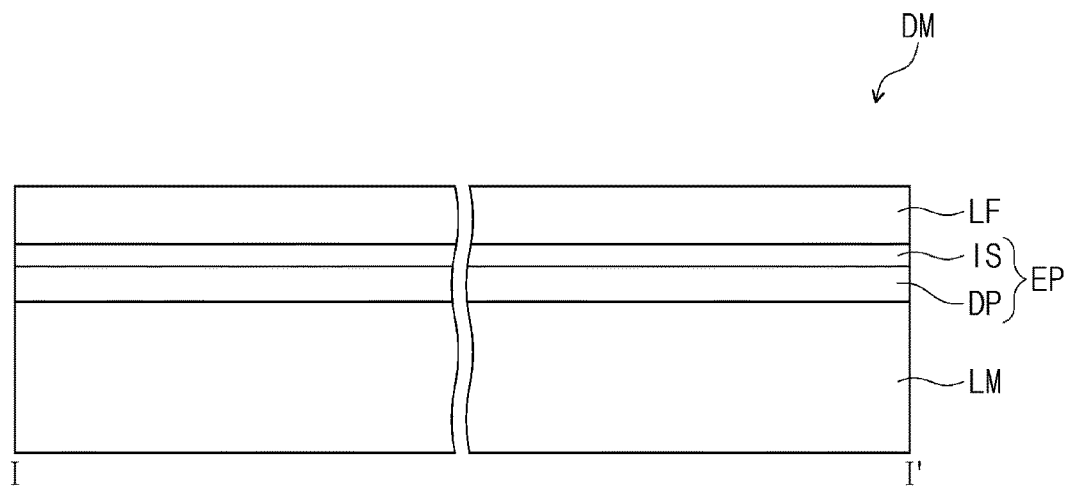
FIG. 2E is a schematic cross-sectional view of a display module according to an embodiment.
Figure 2E:
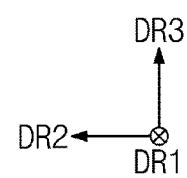

FIG. 2A is an exploded schematic perspective view of an electronic device ED according to an embodiment. FIGS. 2B to 2D are schematic cross-sectional views of a window module WM according to an embodiment. FIG. 2E is a schematic cross-sectional view of a display module DM according to an embodiment. Each of FIGS. 2B to 2E illustrates a cross section corresponding to I-I' in FIG. 2A.

As illustrated in FIG. 2A, the electronic device ED may include a display device DD, an electronic module EM, a power module PSM, and a case EDC. Although not illustrated separately, the power module PSM may further include a mechanism structure for controlling the folding operation of the display device DD.

The display device DD may generate an image and may sense external inputs. The display device DD may include a window module WM and a display module DM. The window module WM may provide the front surface of the electronic device ED. The window module WM will be described in detail later.

The display module DM may include at least a display panel DP. In FIG. 2A, the display module DM is illustrated as including only the display panel DP, the display module DM may include a stacked structure in which multiple components are stacked. A display module DM including a stacked structure of the display module DM will be described in detail later.

The display panel DP may include a display region DP-DA and a non-display region DP-NDA respectively corresponding to the display region DA and the non-display region NDA of the electronic device ED illustrated in FIG. 1A. In the specification, the wording "the region/part and the region/part corresponding" means that corresponding parts/regions may overlap, but are not limited to have the same area. The display module DM may include a driving chip DIC disposed on the non-display region DP-NDA. The display module DM may further include a flexible circuit film FCB coupled to the non-display region DP-NDA.

The driving chip DIC may include driving elements for driving pixels of the display panel DP, for example, a data driving circuit. FIG. 2A illustrates a structure in which the driving chip DIC is mounted on the display panel DP, but the embodiments are not limited thereto. For example, the driving chip DIC may be mounted on the flexible circuit film FCB.

The electronic module EM includes at least a main controller. The electronic module EM may include a wireless communication module, a camera module, a proximity sensor module, an image input module, an audio input module, an audio output module, a memory, an external interface module, etc. The modules may be mounted on the circuit board or may be electrically connected through a flexible circuit board. The electronic module EM is electrically connected to the power module PSM.

The main controller controls the overall operation of the electronic device ED. For example, the main controller activates or deactivates the display device DD according to user inputs. The main controller may control the operation of the display device DD and the other modules. The main controller may include at least one microprocessor.

The case EDC accommodates the display module DM, the electronic module EM, and the power module PSM. The case EDC is illustrated as two cases EDC1 and EDC2 separated from each other, however, the embodiments not limited thereto. Although not illustrated, the electronic device ED may further include a hinge structure for connecting the two cases EDC1 and EDC2. The case EDC may be coupled with the window module WM. The case EDC protects the components accommodated in the case EDC, such as the display module DM, the electronic module EM, and the power module PSM.

Referring to FIG. 2B and FIG. 2C, the window module WM may include a thin glass substrate UTG, a window protective layer PF disposed on the thin glass substrate UTG, and a bezel pattern BP disposed on a lower surface of the window protective layer PF. In an embodiment, the window protective layer PF may include a plastic film PF. Accordingly, the window module WM may further include a first adhesive layer AL1 for bonding the plastic film PF and the thin glass substrate UTG. Unless otherwise specified below, the window protective layer PF may also be described as the plastic film PF, and the symbol "PF" may refer to either element.

The bezel pattern BP may overlap the non-display region DP-NDA illustrated in FIG. 2A. The bezel pattern BP may be disposed on a surface of the thin glass substrate UTG or on a surface of the plastic film PF. FIG. 2B illustrates the bezel pattern BP disposed on the lower surface of the plastic film PF. However, the embodiments are not limited thereto, and the bezel pattern BP may be disposed on the upper surface of the plastic film PF. The bezel pattern BP may be a colored light blocking film and may be formed by, for example, a coating method. The bezel pattern BP may include a base material and a dye or pigment mixed with the base material.

In a plan view, an outer region of an inner edge B-IE of the bezel pattern BP may correspond to the non-display region NDA illustrated in FIG. 1A. The bezel pattern BP may have a closed line shape in a plan view. An inner region of the inner edge B-IE of the bezel pattern BP may correspond to the display region DA illustrated in FIG. 1A.

The thickness of the thin glass substrate UTG may be in a range of about 15 μm to about 100 μm. The thin glass substrate UTG may be chemically strengthened glass. The thin glass substrate UTG may minimize an occurrence of wrinkles even if folding and unfolding are repeated.

A thickness of the plastic film PF may be in a range of about 50 μm to about 100 μm. The plastic film PF may include polyimide, polycarbonate, polyamide, triacetylcellulose, or polymethylmethacrylate, or polyethylene terephthalate. Although not illustrated separately, at least one of a hard coating layer, an anti-fingerprint layer, and an anti-reflection layer may be disposed on the upper surface of the plastic film PF.

The first adhesive layer AL1 may be a pressure sensitive adhesive (PSA) film or an optically clear adhesive (OCA). Adhesive layers described below may also be comprised of the same materials as the first adhesive layer AL1 and may include an adhesive.

The first adhesive layer AL1 may be separated from the thin glass substrate UTG. Since the plastic film PF has a lower strength than the thin glass substrate UTG, it may be relatively easy for scratches to occur. After separating the first adhesive layer AL1 and the plastic film PF, a new plastic film PF may be attached to the thin glass substrate UTG.

In a plan view, the edge U-E of the thin glass substrate UTG may not overlap the bezel pattern BP. The edge U-E of the thin glass substrate UTG is not aligned with an outer edge B-OE of the bezel pattern BP. The edge U-E of the thin glass substrate UTG may also be not aligned with an outer edge P-E of the plastic film PF, and may be not aligned with an outer edge A-E of the first adhesive layer AL1. In the embodiments, it is defined that "in a plan view, a first element and second element do not overlap each other even if they are aligned at an edge but there is no area where the first element and the second element overlap each other." As the above-described conditions are satisfied, the edge U-E of the thin glass substrate UTG may be exposed from the bezel pattern BP in a plan view. Through an inspection device, such as a microscope, it may be possible to detect any fine cracks that may have been generated on the edge U-E of the thin glass substrate UTG. The edge U-E of the thin glass substrate UTG may be photographed from the upper surface of the plastic film PF using the inspection device, and any cracks starting from the edge U-E of the thin glass substrate UTG may be detected.

In a plan view, the edge U-E of the thin glass substrate UTG may be disposed between the edge P-E of the plastic film PF and the outer edge B-OE of the bezel pattern BP. The edge U-E of the thin glass substrate UTG may be sufficiently exposed from the bezel pattern BP.

In a plan view, the edge P-E of the plastic film PF and the edge A-E of the first adhesive layer AL1 may be aligned. The plastic film PF and the first adhesive layer AL1 may have the same area and the same shape.

As illustrated in FIG. 2C, in a plan view, the edge U-E of the thin glass substrate UTG may be aligned with the edge P-E of the plastic film PF. The thin glass substrate UTG and the plastic film PF may have substantially the same area and the same shape.

As described with reference to FIG. 2B and FIG. 2C, the edge U-E of the thin glass substrate UTG may be disposed inside the edge P-E of the plastic film PF or may be aligned with the edge P-E of the plastic film PF. The plastic film PF may completely cover the thin glass substrate UTG and thus prevents damage to the thin glass substrate UTG during the handling of the window module WM. In this respect, the window module WM illustrated in FIG. 2B may reduce the damage to the thin glass substrate UTG compared to the window module WM illustrated in FIG. 2C.

Referring to FIG. 2D, a window protective layer PF may include a plastic resin layer directly disposed on an upper surface of the thin glass substrate UTG. Through an insert molding method, a window module WM may be formed in which the upper surface of the thin glass substrate UTG contacts the plastic resin layer. Before forming the plastic resin layer, the bezel pattern BP may be formed on the upper surface of the thin glass substrate UTG. Therefore, the plastic resin layer may cover the bezel pattern BP.

Although not illustrated separately, the window protective layer PF may further include at least one of an inorganic layer, at least one organic layer, an organic/inorganic composite layer, and a functional coating layer directly disposed on the upper surface of the thin glass substrate UTG. The window protective layer PF may be formed by coating or evaporation, and the edge of the window protective layer PF may be aligned with the edge U-E of the thin glass substrate UTG as illustrated in FIG. 2C.

Referring to FIG. 2E, the display module DM may include the display panel DP, an input sensor IS disposed on the display panel DP, an optical film LF disposed on the input sensor IS, and a lower member LM disposed under the display panel DP. Adhesive layers may be disposed between the members as needed.

The display panel DP may include a base layer, a circuit element layer disposed on the base layer, a display element layer disposed on the circuit device layer, and a thin-film sealing layer disposed on the display element layer. The base layer may include a plastic film. For example, the base layer may include polyimide. Substantially, the planar shape of the base layer is the same as the planar shape of the display panel DP illustrated in FIG. 4A to be described later.

The circuit element layer may include an organic layer, an inorganic layer, a semiconductor pattern, a conductive pattern, and a signal line, etc. An organic layer, an inorganic layer, a semiconductor layer, and a conductive layer may be formed on the base layer through a method such as coating and deposition method. Thereafter, the organic layer, the inorganic layer, the semiconductor layer, and the conductive layer may be selectively patterned through photolithography processes to form a semiconductor pattern, a conductive pattern, and a signal line.

The semiconductor pattern, the conductive pattern, and the signal line may form a pixel driving circuit and signal lines SL1 to SLm, DL1 to DLn, EL1 to ELm, CSL1, CSL2, and PL of the pixels PX illustrated in FIG. 4A to be described later. The pixel driving circuit may include at least one transistor.

The display element layer may include a light emitting element of each of the pixels PX illustrated in FIG. 4A to be described later. The light emitting element may be electrically connected to the transistor. The thin-film sealing layer may be disposed on the circuit element layer to seal the display element layer. The thin-film sealing layer may include an inorganic layer, an organic layer, and an inorganic layer which are stacked in sequence. The embodiments are not limited by the stacked structure of the thin-film sealing layer.

The input sensor IS may include multiple sensing electrodes (not shown) for sensing external inputs, trace lines (not shown) connected to the sensing electrodes, and an inorganic layer and/or an organic layer for insulating/protecting the sensing electrodes and trace lines. The input sensor IS may be a capacitive sensor, but the embodiments are not limited thereto.

During manufacture of the display panel DP, the input sensor IS may be directly formed on the thin-film sealing layer through a continuous process. In an embodiment, the display panel DP with the input sensor IS integrally formed may be defined as an electronic panel EP. However, the embodiments are not limited thereto, and the input sensor IS may be manufactured as a panel separate from the display panel DP and may be attached to the display panel DP via an adhesive layer.

Figure 4A:
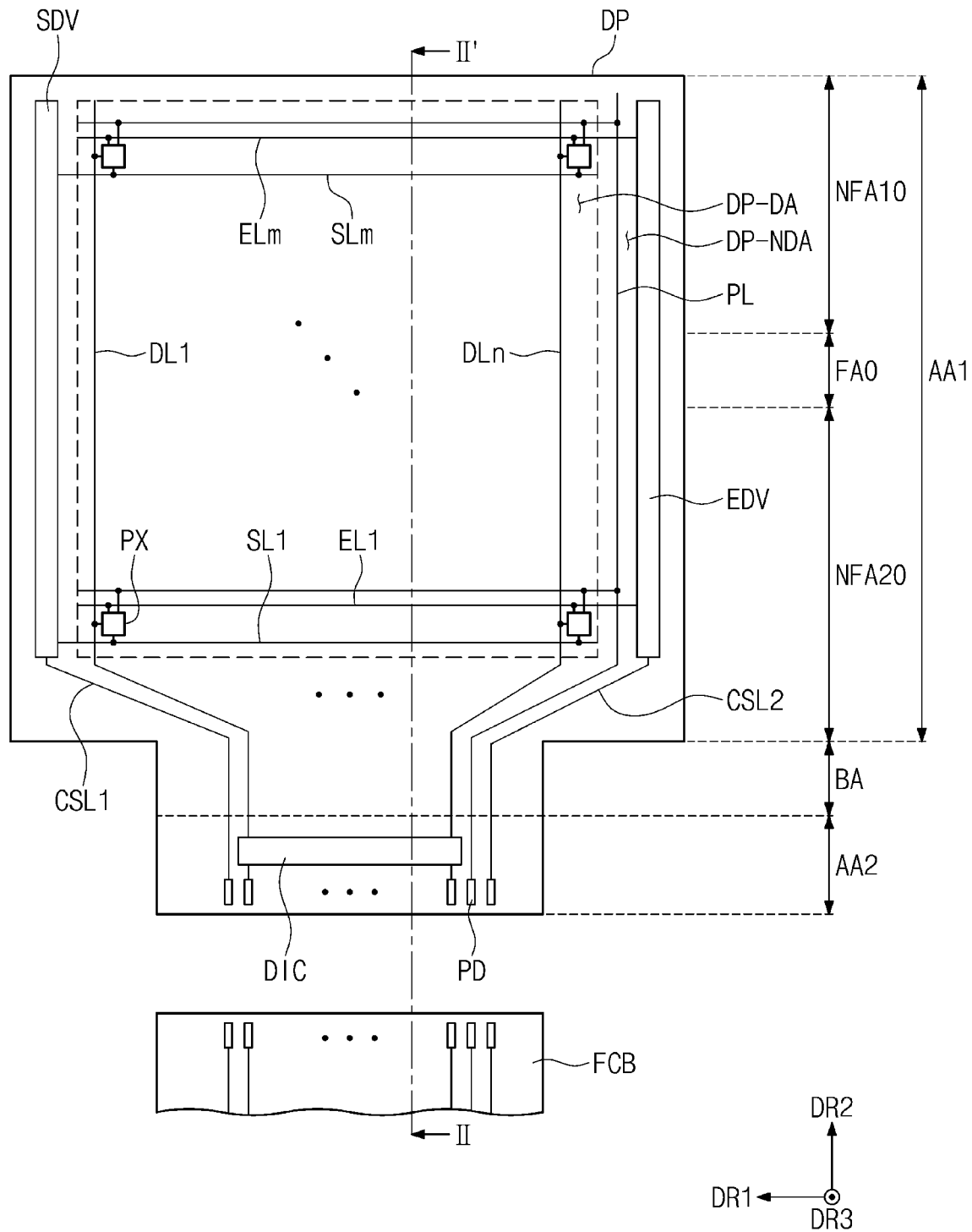
FIG. 4A is a schematic plan view of a display panel according to an embodiment.

The sensing electrodes may overlap the display region DP-DA, (refer to FIG. 4A). The trace lines may be disposed to overlap the non-display region DP-NDA. The trace lines may extend toward the lower end of the second region AA2 through the bending region BA (refer to FIG. 4A) so as to be adjacent to the pad PD illustrated in FIG. 4A. For example, the trace lines may be disposed on a layer different from the signal lines SL1 to SLm, DL1 to DLn, EL1 to ELm, CSL1, CSL2, and PL of the circuit element layer.

The trace lines may be connected to signal lines (input signal lines) provided for the input sensor IS of the display panel DP in a first region AA1 illustrated in FIG. 4A. The input signal lines are different from the signal lines SL1 to SLm, DL1 to DLn, EL1 to ELm, CSL1, CSL2, and PL illustrated in FIG. 4A, but may be disposed on the same layer as any one of these signal lines. Each of the input signal lines may be connected to a corresponding pad PD. As a result, the trace lines may be electrically connected to the same flexible circuit film FCB as the signal lines of the circuit element layer.

The optical film LF may lower the reflectance of external light. The optical film LF may include a retarder and/or a polarizer. The optical film LF may include at least a polarizing film.

The lower member LM may include various functional members. The lower member LM may include, for example, a light shielding layer that blocks light incident on the display panel DP, a shock absorbing layer that absorbs external shock, a support layer that supports the display panel DP, and a heat dissipation layer that emits heat generated from the display panel DP. A stacked structure of the lower member LM is not particularly limited.

FIGS. 3A to 3K are schematic cross-sectional views of the window module WM according to an embodiment.

FIGS. 3A to 3K illustrate only a right part based on FIG. 2B, but the left part may be symmetrical to the right part. Here, symmetry is not limited to a strict mathematical symmetry.

Referring to FIGS. 3A to 3K, a part EDC-U of the case EDC in FIG. 2A is illustrated. In a plan view, the part EDC-U of the case EDC may overlap the window module WM. The sidewall part and the upper part of the case EDC are illustrated, and the part EDC-U is described as an upper part. However, the embodiments are not limited thereto, and the part EDC-U of the case EDC may not overlap the window module WM in a plan view. The upper part EDC-U may be omitted, and the case EDC may be coupled at the side surface of the window module WM.

Although the upper part EDC-U and the window module WM are illustrated to be spaced apart, the embodiments are not limited thereto. The upper part EDC-U and the upper surface of the window module WM may be in contact with each other. Another element (for instance, an adhesive layer or a waterproof kit) may be further disposed between the case EDC and the upper surface or side surface of the window module WM.

Figure 3A:
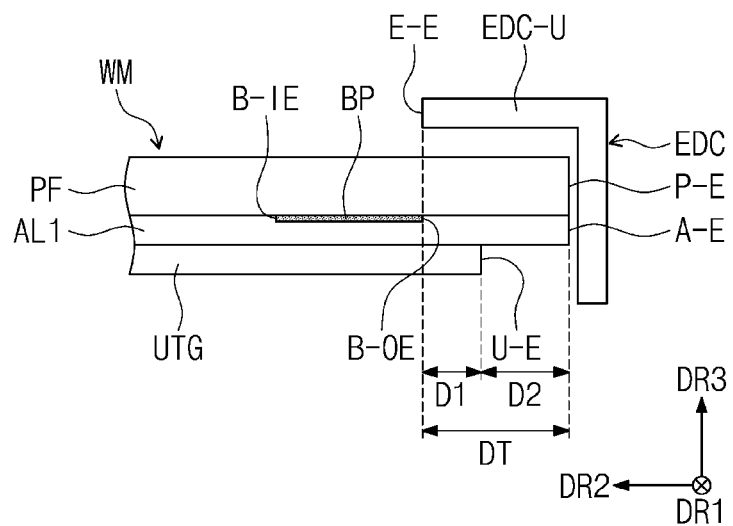
FIGS. 3A to 3K are schematic cross-sectional views of a window module according to an embodiment.

Referring to FIG. 3A, in a plan view, an edge E-E of the upper part EDC-U overlaps the window module WM. An edge U-E of the thin glass substrate UTG may overlap the upper part EDC-U. The edge E-E of the upper part EDC-U may be aligned with the outer edges B-OE of the bezel pattern BP.

A first distance D1 between the outer edge B-OE of the bezel pattern BP and the edge U-E of the thin glass substrate UTG may be about 10 μm or more. In other embodiments, the first distance D1 may be about 30 μm or more, or may be about 70 μm or more. The first distance D1 may be about 190 μm or less. The first distance D1 may also be the distance between an outer edge B-OE1 of the bezel pattern BP-I and the edge U-E of the thin glass substrate UTG illustrated in FIGS. 3D to 3K to be described later.

A second distance D2 between the edge U-E of the thin glass substrate UTG and the outer edge P-E of the plastic film PF may be about 50 μm or more. In other embodiments, the second distance D2 may be about 80 μm or more. The second distance D2 may be about 180 μm or less. A third distance DT between the outer edge B-OE of the bezel pattern BP and the outer edge P-E of the plastic film PF may be about 60 μm or more. In other embodiments, the third distance DT may be about 80 μm or more, or about 150 μm or more. The third distance DT may be about 370 μm or less.

Figure 3B:
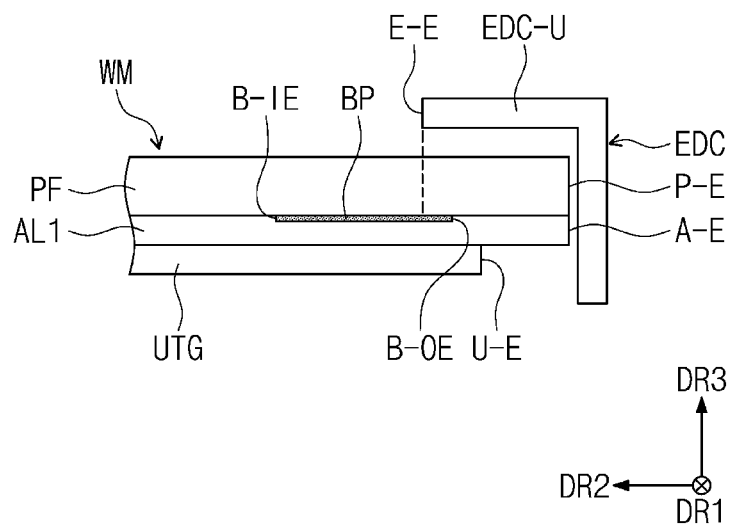

Referring to FIG. 3B, in a plan view, an edge E-E of the upper part EDC-U overlaps the bezel pattern BP. The edge U-E of the thin glass substrate UTG and the outer edge B-OE of the bezel pattern BP may overlap the upper part EDC-U.

Figure 3C:
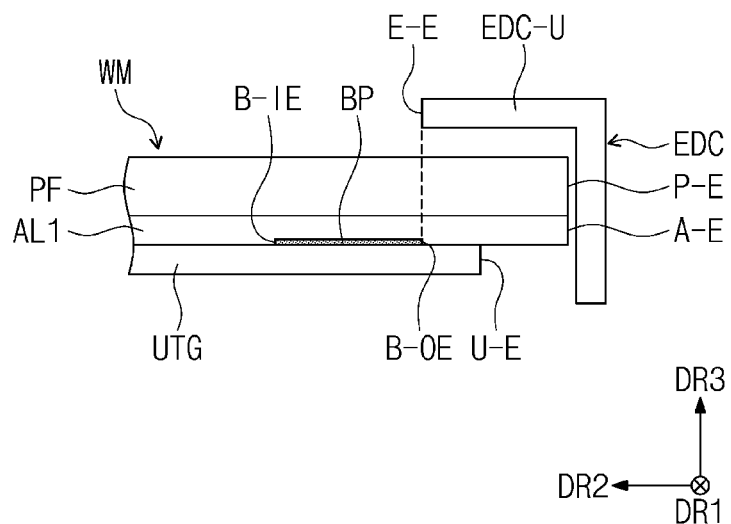

Referring to FIG. 3C, the bezel pattern BP may be disposed on a surface of the thin glass substrate UTG. Although it is illustrated that the bezel pattern BP is disposed on the upper surface of the thin glass substrate UTG, the bezel pattern BP may also be disposed on the lower surface of the thin glass substrate UTG. FIG. 3C illustrates an embodiment in which the edge E-E of the upper part EDC-U is aligned with the outer edge B-OE of the bezel pattern BP, but the embodiments are not limited thereto. As illustrated in FIG. 3B, the outer edge B-OE of the bezel pattern BP may overlap the upper part EDC-U.

As described above, the bezel pattern BP may be disposed on a surface of the plastic film PF or on a surface of the thin glass substrate UTG. Disposing the bezel pattern BP on a surface of the plastic film PF may reduce manufacturing costs. If a defect occurs in the process of forming the bezel pattern BP, the base member on which the bezel pattern BP is printed is discarded together. The price of the thin glass substrate UTG is higher than that of the plastic film PF, and therefore use of the thin glass substrate UTG as a base member may increase manufacturing costs.

As illustrated in FIGS. 3D to 3K, the bezel pattern BP may include multiple patterns. In this embodiment, the bezel pattern BP may include an inner bezel pattern BP-I and an outer bezel pattern BP-O. In a plan view, the inner bezel pattern BP-I is spaced apart from the outer bezel pattern BP-O, and the inner bezel pattern BP-I is disposed inside the outer bezel pattern BP-O. The inner bezel pattern BP-I and the outer bezel pattern BP-O may be formed by the same process, and at least one of the inner bezel pattern and the outer bezel pattern may have a closed line shape. The inner bezel pattern BP-I exposed from the case EDC may have a closed line shape. When the window module WM and the display module DM (refer to FIG. 2A) are aligned, the outer bezel pattern BP-O may serve as a reference pattern for adjusting the alignment between the modules.

Figure 3D:
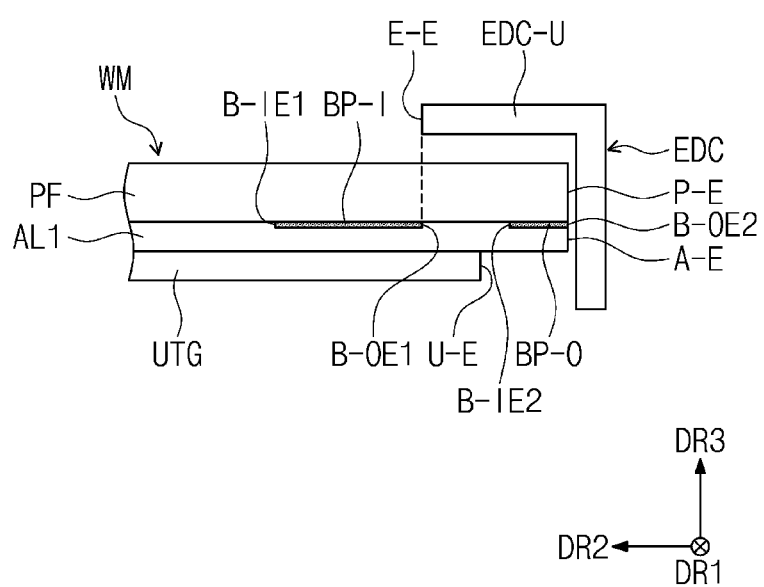
Figure 3E:
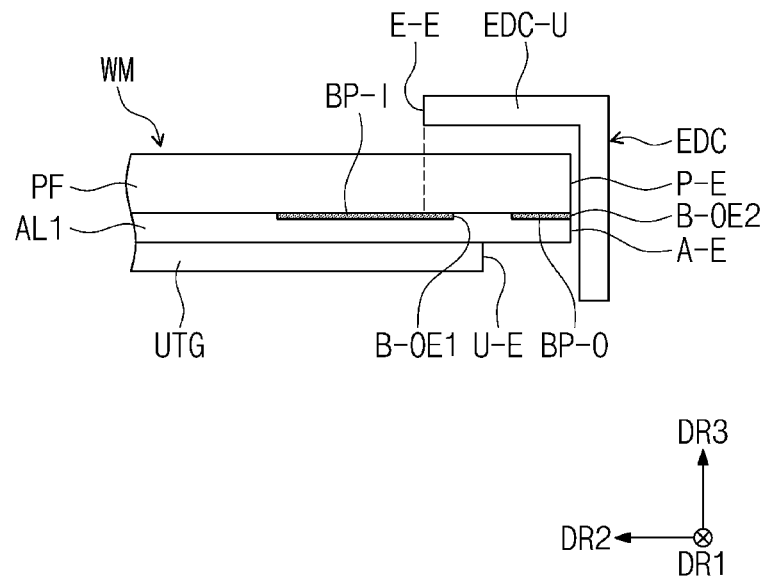

Referring to FIG. 3D, the inner bezel pattern BP-I and the outer bezel pattern BP-O may each include an inner edge (B-IE1, B-IE2) and an outer edge (B-OE1, B-OE2). In a plan view, the edge U-E of the thin glass substrate UTG may be disposed between the outer edge B-OE1 of the inner bezel pattern BP-I and the inner edge B-IE2 of the outer bezel pattern BP-O. In a plan view, the outer edge B-OE1 of the inner bezel pattern BP-I may be aligned with the edge E-E of the upper part EDC-U. In a plan view, the outer edge B-OE2 of the outer bezel pattern BP-O may be aligned with the edge P-E of the plastic film PF. Referring to FIG. 3E, in a plan view, the edge E-E of the upper part EDC-U may overlap the inner bezel pattern BP-I.

Figure 3F:
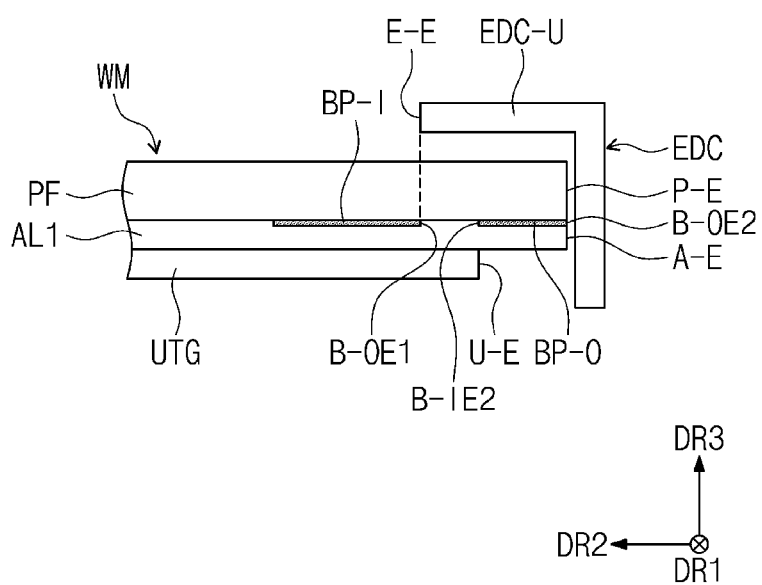
Figure 3G:
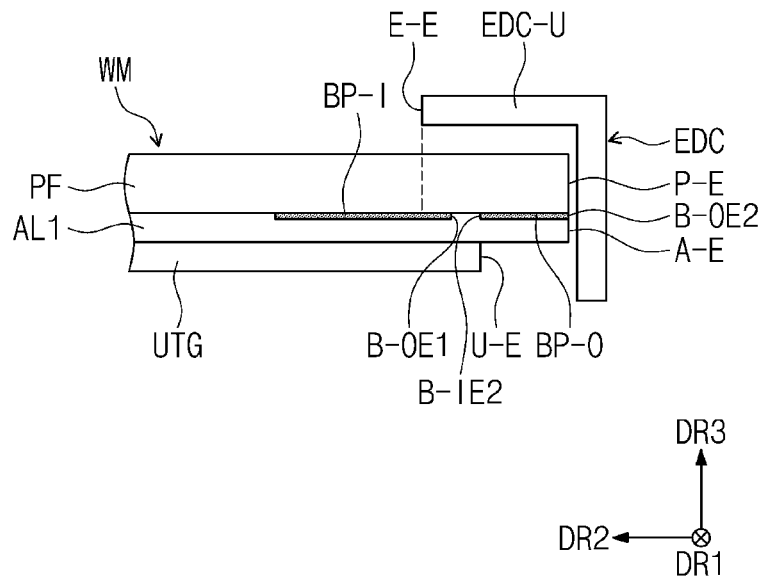

The window module WM illustrated in FIGS. 3F to 3K will be described focusing on differences from the window module WM illustrated in FIGS. 3D and 3E. Referring to FIG. 3F and FIG. 3G, in a plan view, the edge U-E of the thin glass substrate UTG may be aligned with the inner edge B-IE2 of the outer bezel pattern BP-O. Since cracks occur at the edge U-E of the thin glass substrate UTG and extend inward, a crack may be detected even when the edge U-E of the thin glass substrate UTG and the inner edge B-IE2 of the outer bezel pattern BP-O are aligned. However, in a plan view, when the edge U-E of the thin glass substrate UTG is aligned with the outer edge B-OE2 of the outer bezel pattern BP-O, cracks may be hidden by the outer bezel pattern BP-O and may not be detected.

Figure 3H:
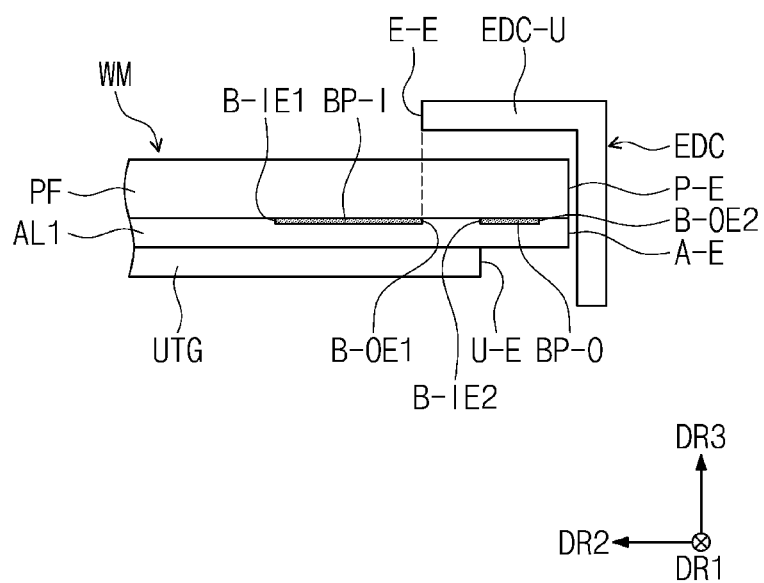
Figure 3I:
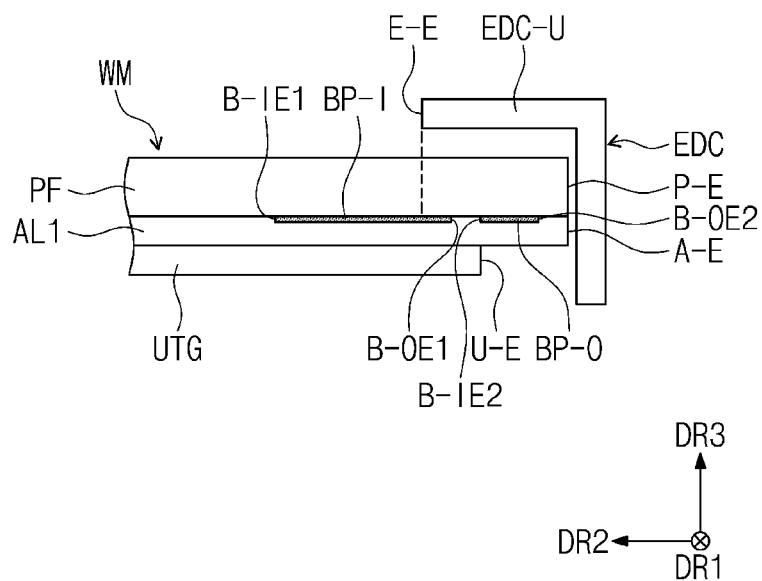
Figure 3J:
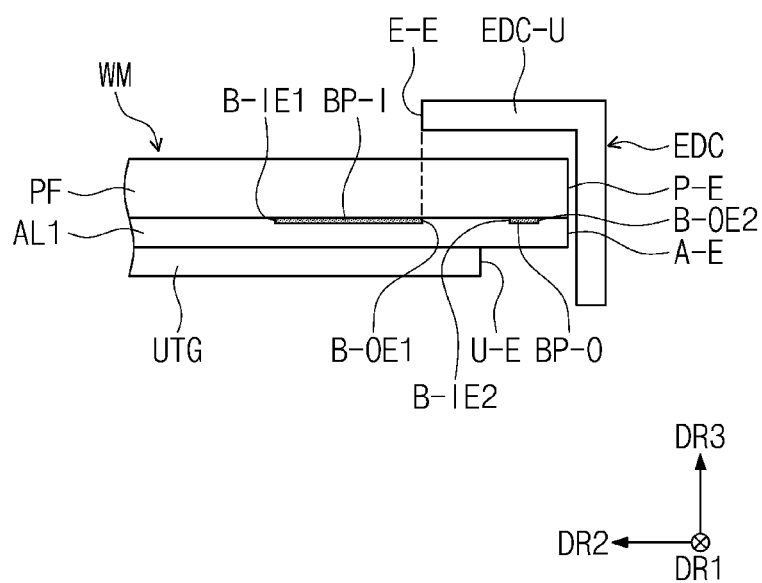
Figure 3K:
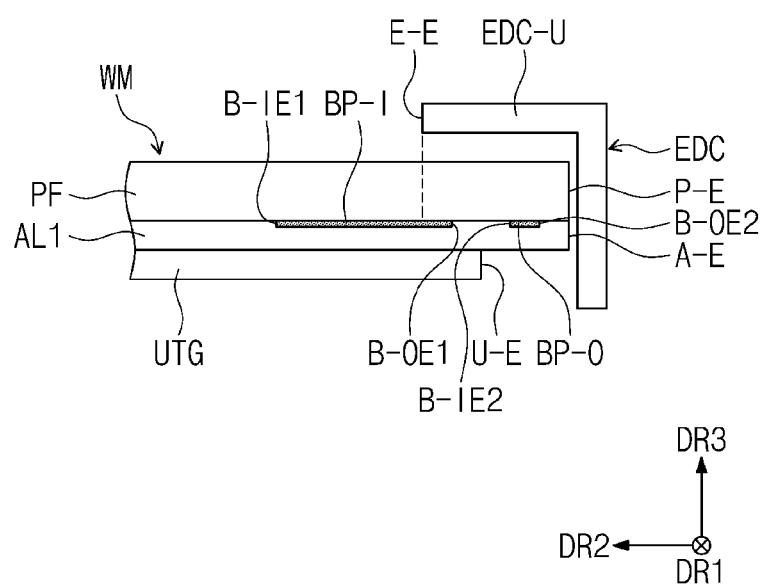

Referring to FIGS. 3H to 3K, in a plan view, the outer edge B-OE2 of the outer bezel pattern BP-O may be not aligned with the edge P-E of the plastic film PF. In a plan view, the outer bezel pattern BP-O may be disposed inside the plastic film PF. Referring to FIGS. 3H to 3I, in a plan view, the edge U-E of the thin glass substrate UTG may be aligned with the inner edge B-IE2 of the outer bezel pattern BP-O. Referring to FIGS. 3J to 3K, in a plan view, the edge U-E of the thin glass substrate UTG may be not aligned with the inner edge B-IE2 of the outer bezel pattern BP-O. In a plan view, the inner edge B-IE2 of the outer bezel pattern BP-O may be disposed outside the edge U-E of the thin glass substrate UTG.

Figure 4B:
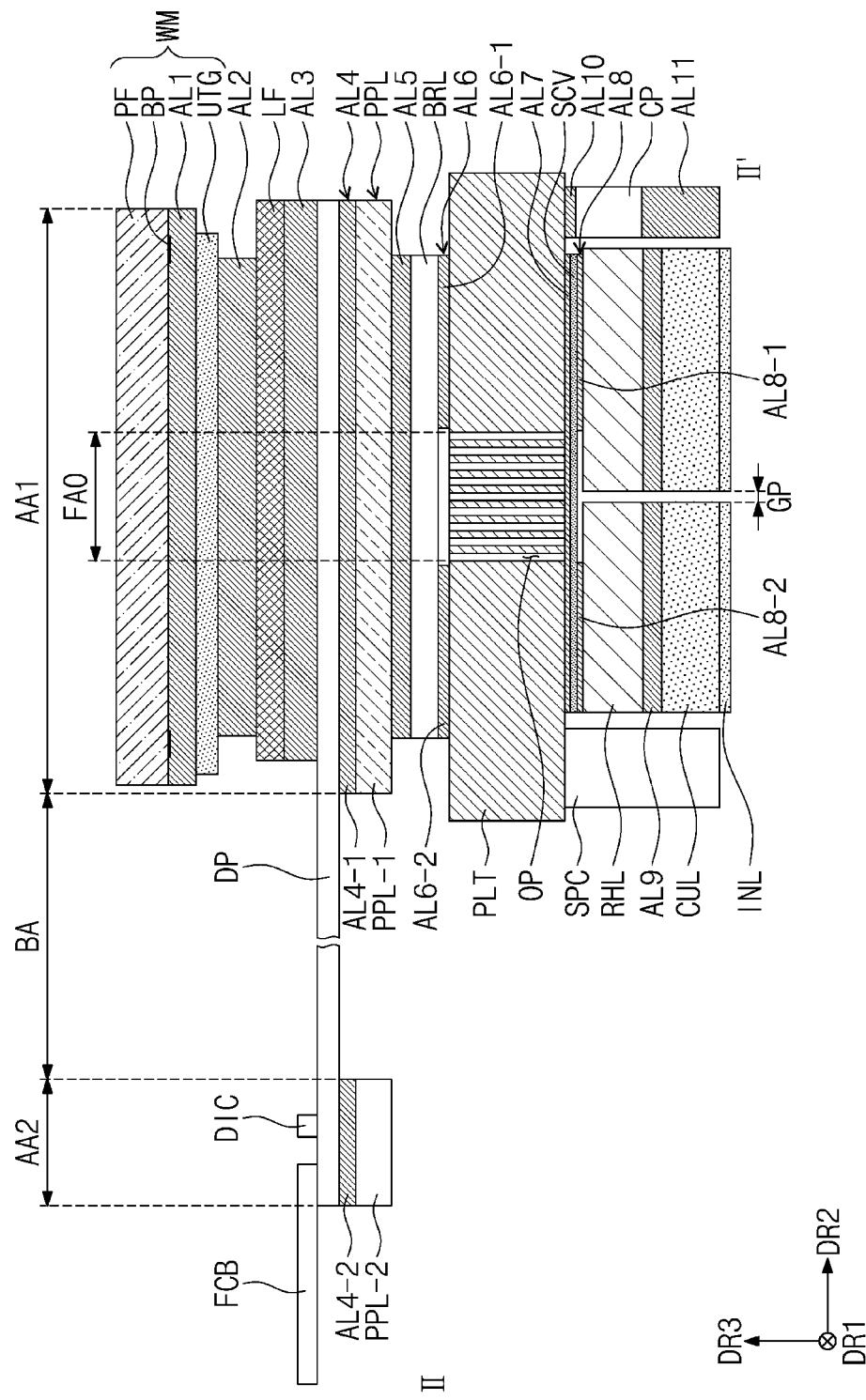
FIG. 4B is a schematic cross-sectional view of a display device according to an embodiment.
Figure 4D:
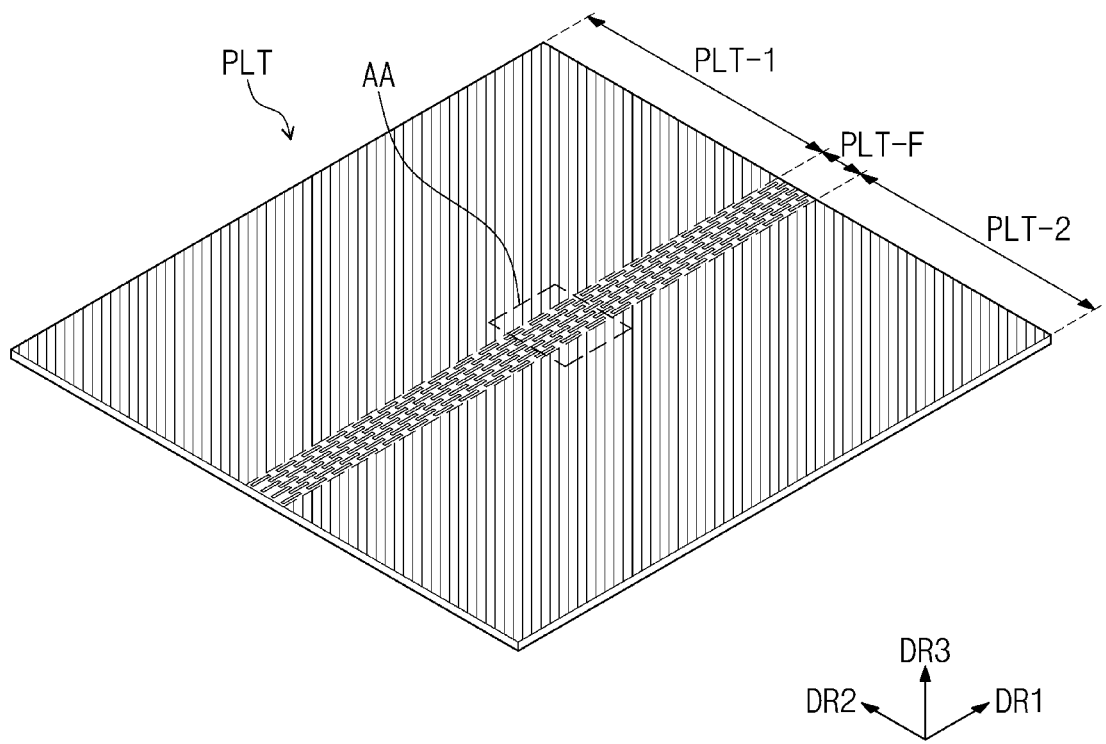
FIG. 4D is a schematic plan view of a support layer according to an embodiment.
Figure 4E:
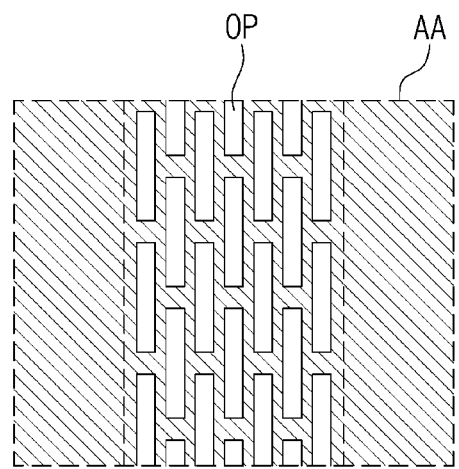
FIG. 4E is an enlarged plan view of FIG. 4C.
Figure 4F:
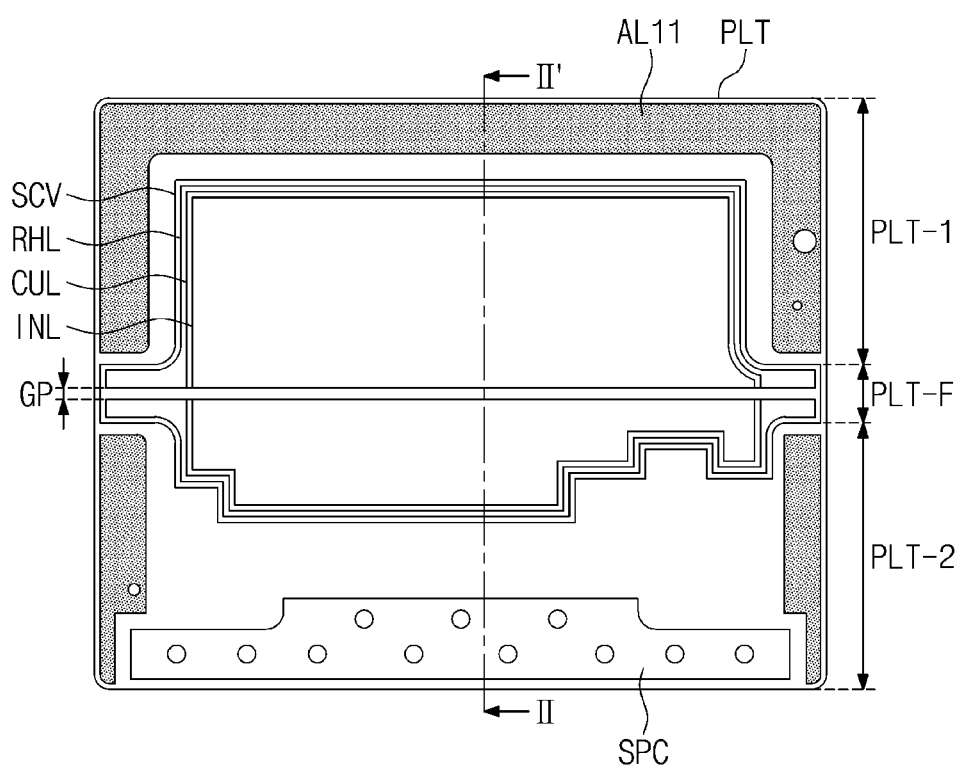
FIG. 4F is a schematic rear view of a display device according to an embodiment.

FIG. 4A is a schematic plan view of a display panel DP according to an embodiment. FIG. 4B is a schematic cross-sectional view of the display device DD according to an embodiment. FIG. 4C is a schematic cross-sectional view of the display device DD according to an embodiment. FIG. 4D is a schematic plan view of a support layer PLT according to an embodiment. FIG. 4E is an enlarged schematic plan view of FIG. 4C. FIG. 4F is a schematic rear view of the display device DD according to an embodiment. FIG. 4B illustrates cross sections taken along line II-II' of FIG. 4A and FIG. 4E.

Referring to FIG. 4A, the display panel DP may include a display region DP-DA and a non-display region DP-NDA around the display region DP-DA. The display region DP-DA and the non-display region DP-NDA are distinguished according to the presence or absence of pixels PX. The pixels PX are disposed in the display region DP-DA. A scan driver SDV, a data driver, and a light emitting driver EDV may be disposed in the non-display region DP-NDA. The data driver may be some circuits constituting the driving chip DIC illustrated in FIG. 4A.

The display panel DP includes a first region AA1, a second region AA2, and a bending region which are identified in the second direction DR2. The second region AA2 and the bending region BA may each be a part of the non-display region DP-NDA. The bending region BA is disposed between the first region AA1 and the second region AA2.

FIG. 4B illustrates an unfolded state before the display panel DP is bent. Assuming that the display panel DP is installed in the electronic device ED, when the electronic device ED is unfolded as illustrated in FIG. 1A, the first region AA1 and the second region AA2 of the display panel DP are disposed on different planes. This is illustrated in FIG. 4C. The bending shape of the bending region BA will be described later with reference to FIG. 4C.

Referring back to FIG. 4A, the first region AA1 is a region corresponding to the display surface DS of FIG. 1A. The first region AA1 may include a first non-folding region NFA10, a second non-folding region NFA20, and a folding region FA0. The first non-folding region NFA10, the second non-folding region NFA20, and the folding region FA0 respectively correspond to the first non-folding region NFA1, the second non-folding region NFA2, and the folding region FA in FIG. 1A and FIG. 1B.

The lengths of the bending region BA and the second region AA2 in the first direction DR1 may be smaller than the length of the first region AA1. A region with a short length in the bending axis direction may be bent more easily.

The display panel DP may include multiple pixels PX, scan lines SL1 to SLm, data lines DL1 to DLn, emission lines EL1 to ELm, first and second control lines (CSL1, CSL2), a power line PL, and multiple pads PD. Here, m and n are natural numbers. The pixels PX may be connected to the scan lines SL1 to SLm, the data lines DL1 to DLn, and the emission lines EL1 to ELm.

The scan lines SL1 to SLm may extend in the first direction DR1 and be connected to the scan driver SDV. The data lines DL1 to DLn may extend in the second direction DR2 and be connected to the driving chip DIC via the bending region BA. The light emitting lines EL1 to ELm may extend in the first direction DR1 and be connected to the light emitting driver EDV.

A power line PL may include a portion extending in the second direction DR2 and a portion extending in the first direction DR1. The portion extending in the first direction DR1 and the portion extending in the second direction DR2 may be disposed on different layers. A portion, of the power line PL, extending in the second direction DR2 may extend toward the second region AA2 via the bending region BA. The power line PL may provide a first voltage to the pixels PX.

The first control line CSL1 may be connected to the scan driver SDV and extend toward the lower end of the second region AA2 via the bending region BA. The second control line CSL2 may be connected to the light emitting driver EDV and extend toward the lower end of the second region AA2 via the bending region BA.

In a plan view, the pads PD may be disposed adjacent to the lower end of the second region AA2. The driving chip DIC, the power line PL, the first control line CSL1, and the second control line CSL2 may be connected to the pads PD. The flexible circuit film FCB may be electrically connected to the pads PD by an anisotropic conductive adhesive layer.

Referring to FIG. 4B and FIG. 4C, the display device DD may include a window module WM and a display module DM. The window module WM may be any one of the window modules WM described with reference to FIGS. 2A to 3K.

The display module DM may include an optical film LF, a display panel DP, a panel protective layer PPL, a barrier layer BRL, a support layer PLT, a cover layer SCV, and a heat dissipation layer RHL, a cushion layer CUL, an insulating layer INL, a spacer SPC, a step compensation pattern CP, and second to eleventh adhesive layers AL2 to AL11. The second to eleventh adhesive layers AL2 to AL11 may include a transparent adhesive such as a pressure sensitive adhesive or an optically transparent adhesive. Some of the above-described elements may be omitted in an embodiment. For example, the step compensation pattern CP and associated the tenth and eleventh adhesive layers AL10 and AL11 may be omitted.

The optical film LF may be disposed in the first region AA1 illustrated in FIG. 4A. The optical film LF may cover at least the display region DP-DA. The second adhesive layer AL2 may couple the optical film LF and the window module WM, and the third adhesive layer AL3 may couple the optical film LF and the display panel DP. Although only the display panel DP is illustrated in FIG. 4B, the input sensor IS may be further disposed between the display panel DP and the third adhesive layer AL3, similar to the electronic panel EP illustrated in FIG. 2E.

The panel protective layer PPL may be disposed under the display panel DP. The panel protective layer PPL may protect the lower portion of the display panel DP. The panel protective layer PPL may include a flexible plastic material. For example, the panel protective layer PPL may include polyethylene terephthalate. In an embodiment, the panel protective layer PPL may not be disposed in the folding region FA. The fourth adhesive layer AL4 couples the panel protective layer PPL and the display panel DP, and the fifth adhesive layer AL5 couples the panel protective layer PPL and the barrier layer BRL.

The panel protective layer PPL may include a first panel protective layer PPL-1 that protects the first region AA1 of the display panel DP and a second panel protective layer PPL-2 that protects the second region AA2. When the bending region BA is bent, the second panel protective layer PPL-2 may be disposed below the first region AA1 and the first panel protective layer PPL-1 together with the second region AA2. Since the panel protective layer PPL is not disposed in the bending region BA, the bending region BA may be more easily bent. The fourth adhesive layer AL4 may include a first part AL4-1 corresponding to the first panel protective layer PPL-1 and a second part AL4-2 corresponding to the second panel protective layer PPL-2.

A barrier layer BRL may be disposed under a panel protective layer PPL. The barrier layer BRL may increase resistance against a compressive force caused by external press. Therefore, the barrier layer BRL may prevent deformation of the display panel DP. The barrier layer BRL may include a flexible plastic material such as polyimide or polyethylene terephthalate. The barrier layer BRL may be a colored film having a low light transmittance. The barrier layer BRL may absorb light incident from the outside. For example, the barrier layer BRL may be a black plastic film. When viewing the display device DD from the upper side of the window protective layer PF, components disposed below the barrier layer BRL may not be visible to a user. The fifth adhesive layer AL5 couples the panel protective layer PPL and the barrier layer BRL, and the sixth adhesive layer AL6 couples the barrier layer BRL and a support layer PLT.

The support layer PLT is disposed under the barrier layer BRL. The support layer PLT may include a material having an elastic modulus of about 60 GPA or more. The support layer PLT may include a metal material such as stainless steel. For example, the support layer PLT may include SUS 304, but is not limited thereto, and the support layer PLT may thus include other metal materials. The support layer PLT may support the display panel DP. The heat dissipation performance of the display device DD may be improved by the support layer PLT.

Multiple openings OP may be defined in the region of the support layer PLT corresponding to the folding region FA0. The flexibility of the support layer PLT is improved by the openings OP. The sixth adhesive layer AL6 may include a first part AL6-1 and a second part AL6-2 which are spaced apart from each other. The flexibility of the support layer PLT may be improved because the sixth adhesive layer AL6 is not disposed in a region corresponding to the folding region FA0.

The support layer PLT will be described in detail with reference to FIG. 4D and FIG. 4E. The support layer PLT may include a folding region PLT-F corresponding to the folding region FA0 illustrated in FIG. 4A, a first region PLT-1 corresponding to the first non-folding region NFA10, and a second region PLT-2 corresponding to the second non-folding region NFA20. Multiple openings OP may be formed in the folding region PLT-F.

The openings OP may be arranged according to a predetermined rule. The openings OP may be arranged in a grid shape. Since the openings OP are formed in the folding region PLT-F, the area of the folding region PLT-F may be reduced thereby lowering the stiffness of the folding region PLT-F. Accordingly, the folding region PLT-F may have higher flexibility than that in the case where the openings OP are not formed.

Referring back to FIG. 4B and FIG. 4C, the seventh adhesive layer AL7 couples the support layer PLT and the cover layer SCV, and the eighth adhesive layer AL8 couples the cover layer SCV and the heat dissipation layer RHL. The cover layer SCV may cover the openings OP defined in the support layer PLT. The cover layer SCV may have a lower elastic modulus than the support layer PLT. For example, the cover layer SCV may include a thermoplastic polyurethane, a rubber, or a silicone, but the embodiments are not limited thereto.

The cover layer SCV may be manufactured in a sheet form and attached to the support layer PLT. The eighth adhesive layer AL8 may include a first part AL8-1 and a second part AL8-2 which are spaced apart from each other. Since the eighth adhesive layer AL8 is not disposed in the region corresponding to the folding region FA0, the flexibility of the cover layer SCV may be improved.

The heat dissipation layer RHL may be a sheet having high thermal conductivity. The heat dissipation layer RHL may include copper, a copper alloy, or graphite. The ninth adhesive layer AL9 couples the heat dissipation layer RHL and the cushion layer CUL.

The cushion layer CUL may absorb external shocks to protect the display panel DP. The cushion layer CUL may include a foam sheet having a predetermined elasticity. The cushion layer CUL may include sponge or polyurethane.

The insulating layer INL may be disposed under the cushion layer CUL. An embodiment in which an insulating tape is disposed is illustrated. The insulating layer INL may prevent static electricity from being introduced thereinto. Although not illustrated in FIG. 4C, the flexible circuit film FCB illustrated in FIG. 4B is disposed on the insulating layer INL. The insulating layer INL may prevent electrical interference between the flexible circuit film FCB and components disposed on the insulating layer INL.

The heat dissipation layer RHL, the ninth adhesive layer AL9, the cushion layer CUL, and the insulating layer INL may each include two portions spaced apart from each other with a predetermined gap GP. The gap GP may be in a range of about 0.3 mm to about 3 mm, and may be disposed to correspond to the folding region FA0.

One surface of the step compensated pattern CP may be coupled to the support layer PLT by the tenth adhesive layer AL10. The eleventh adhesive layer AL11 is disposed on the other surface of the step compensated pattern CP. The eleventh adhesive layer AL11 may be used when the display device DD is combined with other components of the electronic device. The lower member LM illustrated in FIG. 2E may include a stacked structure from the fourth insulating layer AL4 to the insulating layer INL of FIG. 4B.

Referring to FIGS. 4B and 4C, the bending region BA may be bent so that the second region AA2 is disposed under the first region AA1. Accordingly, the driving chip DIC may be disposed under the first region AA1. The first region AA1 and the second region AA2 are disposed on different planes (or reference planes). The bending region BA is convexly bent in the transverse direction on the cross section. The bending region BA has a predetermined curvature and a radius of curvature. The radius of curvature may be about 0.1 mm to about 0.5 mm.

The bending protective layer BPL is disposed at least in the bending region BA. The bending protective layer BPL may overlap the bending region BA, the first region AA1, and the second region AA2. The bending protective layer BPL may be disposed on a portion of the first region AA1 and a portion of the second region AA2.

The bending protective layer BPL may be bent together with the bending region BA. The bending protective layer BPL protects the bending region BA from external shock and controls a neutral plane of the bending region BA. The bending protective layer BPL controls the stress of the bending region BA so that the neutral plane becomes close to the signal lines disposed in the bending region BA.

One surface of the second panel protective layer PPL-2 which is not attached to the second part AL4-2 of the fourth adhesive layer AL4 may be attached to the spacer SPC. Although the spacer SPC is illustrated as a single layer in FIG. 4B and FIG. 4C, the spacer SPC may have a multilayer structure in which a base layer is disposed between two adhesive layers. The base layer may include graphite and may utilize its heat dissipation properties as well as other properties.

FIG. 4F illustrates the lower surface of the support layer PLT. A cover layer SCV, a heat dissipation layer RHL, a cushion layer CUL, and an insulating layer INL may be sequentially disposed on the lower surface of the support layer PLT. This stacked structure may be disposed in part of the lower surface of the support layer PLT. The cover layer SCV overlaps the folding region PLT-F. It is illustrated that the areas of the cover layer SCV, the heat dissipation layer RHL, the cushion layer CUL, and the insulating layer INL become smaller in this order. However, the embodiments are not limited thereto. The spacer SPC may be disposed to be spaced apart from the stacked structure. Referring to FIG. 4F, the eleventh adhesive layer AL11 overlapping the step compensation pattern CP, (refer to FIG. 4B) may be disposed outside the multilayer structure and disposed along the edge of the support layer PLT.

According to an embodiment, cracks generated on the edges of a thin glass substrate may be inspected. An electronic device with a reduced defect rate may be provided.

Although the embodiments have been described, it is understood that the disclosure should not be limited to these embodiments but various changes and modifications can be made by one ordinary skilled in the art within the spirit and scope of the disclosure as hereinafter claimed. Accordingly, the technical scope of the disclosure should not be limited to the contents described in the detailed description of the specification, but should be determined by the claims.

What is claimed is:

1. A display device comprising:
   a display module including a display area and a non-display area; and
   a window module disposed on the display module, the window module including:
      a thin glass substrate;
      a window protective layer disposed on the thin glass substrate; and
      a bezel pattern disposed on a surface of the thin glass substrate or disposed on a surface of the window protective layer, the bezel pattern overlapping the non-display area, wherein
      an edge of the thin glass substrate does not overlap the bezel pattern in a plan view, and
      the edge of the thin glass substrate is not aligned with an outer edge of the bezel pattern in a plan view.

2. The display device of claim 1, wherein
   the window protective layer comprises a plastic film, and
   the window module further comprises an adhesive layer that attaches the plastic film and the thin glass substrate.

3. The display device of claim 2, wherein the edge of the thin glass substrate is disposed between the edge of the plastic film and the outer edge of the bezel pattern in a plan view.

4. The display device of claim 2, wherein a distance between the outer edge of the bezel pattern and the edge of the thin glass substrate is about 10 μm or more in a plan view.

5. The display device of claim 2, wherein a distance between the edge of the thin glass substrate and the edge of the plastic film is about 50 μm or more in a plan view.

6. The display device of claim 2, wherein a distance between the edge of the plastic film and the outer edge of the bezel pattern is about 60 μm or more in a plan view.

7. The display device of claim 2, wherein the edge of the plastic film and the edge of the adhesive layer are aligned in a plan view.

8. The display device of claim 2, wherein the bezel pattern is disposed between the adhesive layer and the plastic film.

9. The display device of claim 2, wherein the adhesive layer is separable from the thin glass substrate.

10. The display device of claim 1, wherein
the bezel pattern comprises an inner bezel pattern and an outer bezel pattern, and
the inner bezel pattern and the outer bezel pattern are spaced apart from each other in a plan view.

11. The display device of claim 10, wherein the edge of the thin glass substrate is disposed between an outer edge of the inner bezel pattern and an inner edge of the outer bezel pattern in a plan view.

12. The display device of claim 10, wherein the edge of the thin glass substrate is aligned with an inner edge of the outer bezel pattern in a plan view.

13. The display device of claim 10, wherein an outer edge of the outer bezel pattern is aligned with an edge of the window protective layer or disposed inside the edge of the window protective layer in a plan view.

14. The display device of claim 10, wherein at least one of the inner bezel pattern and the outer bezel pattern has a closed line shape in a plan view.

15. The display device of claim 1, wherein the edge of the thin glass substrate is disposed inside the edge of the window protective layer in a plan view.

16. The display device of claim 1, wherein a thickness of the thin glass substrate is in a range of about 15 μm to about 100 μm.

17. The display device of claim 1, wherein the thin glass substrate is a chemically strengthened glass.

18. The display device of claim 1, wherein the display device is foldable.

19. The display device of claim 1, wherein the display module comprises:
a display panel;
an input sensor disposed on the display panel;
an optical film disposed on the input sensor; and
a lower member disposed under the display panel.

20. The display device of claim 19, wherein the lower member comprises:
a protective layer disposed under the display panel;
a barrier layer disposed under the protective layer;
a support layer disposed under the barrier layer;
a cover layer disposed under the support layer;
a heat dissipation layer disposed under the cover layer;
a cushion layer disposed under the heat dissipation layer; and
an insulation layer disposed under the cushion layer.

21. The display device of claim 1, wherein the bezel pattern being a light blocking film, the bezel pattern being arranged at a location that does not interfere with an inspection from an upper side of the display device for cracks starting from the edge of the thin glass substrate, the display module including a display panel that includes a plurality of pixels that each include a light emitting element, the window module being arranged on an upper surface of the display module.

22. A display device comprising:
a display panel;
an input sensor contacting an upper surface of the display panel;
an optical film disposed on the input sensor and coupled to the input sensor by a first adhesive layer;
a thin glass substrate disposed on the optical film and coupled to the optical film by a second adhesive layer;
a plastic film disposed on the thin glass substrate and coupled to the thin glass substrate by a third adhesive layer; and
a bezel pattern disposed between the third adhesive layer and the plastic film, wherein
an edge of the thin glass substrate does not overlap the bezel pattern in a plan view, and
the edge of the thin glass substrate is not aligned with an outer edge of the bezel pattern in a plan view.

23. The display device of claim 22, wherein the edge of the thin glass substrate is disposed inside the edge of the plastic film in a plan view.

24. The display device of claim 22, wherein an edge of the third adhesive layer is aligned with the edge of the plastic film in a plan view.

25. An electronic device comprising:
a display device;
an electronic module electrically connected to the display device; and
a case accommodating the display device and the electronic module, wherein
the display device includes:
a display module including a display area and a non-display area; and
a window module disposed on the display module,
the window module includes:
a thin glass substrate;
a window protective layer disposed on the thin glass substrate; and
a bezel pattern disposed on a surface of the thin glass substrate or disposed on a lower surface of the window protective layer, the bezel pattern overlapping the non-display area,
an edge of the thin glass substrate does not overlap the bezel pattern in a plan view,
the edge of the thin glass substrate is not aligned with an outer edge of the bezel pattern in a plan view, and
the case overlaps a part of the window module in a plan view.

26. The electronic device of claim 25, wherein an edge of the case is aligned with the outer edge of the bezel pattern or overlaps the bezel pattern.

27. The electronic device of claim 26, wherein
the bezel pattern comprises an inner bezel pattern and an outer bezel pattern,
the inner bezel pattern and the outer bezel pattern are spaced apart from each other in a plan view, and
the edge of the case is aligned with an outer edge of the inner bezel pattern or overlaps the inner bezel pattern.

* * * * *